(12) United States Patent
Luo et al.

(10) Patent No.: US 10,757,834 B2
(45) Date of Patent: Aug. 25, 2020

(54) METHOD AND APPARATUS FOR DETERMINING WATER CHILLING UNIT FOR COOLING DATA CENTER

(71) Applicant: BEIJING BAIDU NETCOM SCIENCE AND TECHNOLOGY CO., LTD., Beijing (CN)

(72) Inventors: Zhiming Luo, Beijing (CN); Tianyu Zhou, Beijing (CN); Binghua Zhang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 43 days.

(21) Appl. No.: 16/054,820

(22) Filed: Aug. 3, 2018

(65) Prior Publication Data

US 2019/0104642 A1 Apr. 4, 2019

(30) Foreign Application Priority Data

Sep. 29, 2017 (CN) .......................... 2017 1 0911983

(51) Int. Cl.
*H05K 7/20* (2006.01)
(52) U.S. Cl.
CPC ....... *H05K 7/20281* (2013.01); *H05K 7/2079* (2013.01); *H05K 7/20763* (2013.01); *H05K 7/20836* (2013.01)
(58) Field of Classification Search
CPC ........... H05K 7/20281; H05K 7/20763; H05K 7/2079; H05K 7/20836
See application file for complete search history.

(56) References Cited

U.S. PATENT DOCUMENTS

| 4,463,574 A | * | 8/1984 | Spethmann | F25B 49/02 62/175 |
| 4,703,325 A | * | 10/1987 | Chamberlin | G07C 3/00 340/517 |
| 2017/0089601 A1 | * | 3/2017 | Patil | F24F 11/62 |
| 2018/0373234 A1 | * | 12/2018 | Khalate | G06F 11/07 |

FOREIGN PATENT DOCUMENTS

CN 104654525 A 5/2015

* cited by examiner

*Primary Examiner* — Chad G Erdman
(74) *Attorney, Agent, or Firm* — Seed IP Law Group LLP (57) ABSTRACT

A method and apparatus for determining a water chilling unit for cooling a data center are provided. The method includes: acquiring a current water output parameter, a current water input parameter, a current water flow parameter and a current outdoor temperature parameter of each water chilling unit of the data center; pre-processing the water output parameter, the water input parameter, the water flow parameter and the outdoor temperature parameter to obtain a characteristic parameter of each water chilling unit; importing the characteristic parameters of each water chilling unit into a pre-established machine learning model to obtain the current electric power of each water chilling unit; and determining a water chilling unit for cooling the data center on the basis of a preset cooling load, a rated cooling capacity of the water chilling unit and the current electric power of each water chilling unit.

9 Claims, 4 Drawing Sheets

METHOD AND APPARATUS FOR DETERMINING WATER CHILLING UNIT FOR COOLING DATA CENTER

CROSS-REFERENCE TO RELATED APPLICATIONS

This application claims the priority of Chinese Application No. 201710911983.8, filed on Sep. 29, 2017, titled "Method and Apparatus for Determining Water Chilling Unit for Cooling Data Center," the entire disclosure of which is incorporated herein by reference.

TECHNICAL FIELD

The present disclosure relates to the technical field of industrial control, specifically to the field of temperature control, and in particular to a method and apparatus for determining a water chilling unit for cooling a data center.

BACKGROUND

With the development of the Internet, the number of data centers providing services to the Internet is also increasing year by year. The resulting energy consumption problems of the data centers are also becoming increasingly prominent. In the traditional data center, the energy consumption of water chilling units accounts for about 40% of the total energy consumption of the data center. Therefore, how to reduce the energy consumption of water chilling units has become the key to energy conservation and emission reduction of data center infrastructure.

At present, according to a cooling load demand of a machine room, operation and maintenance staffs of the data centers may turn off water chilling units in an order of turning on the water chilling units to reduce the energy consumption.

However, in this type of regulation and control mode, since the staffs of the data center cannot acquire efficiency data of the water chilling units, whether to shut down/start each water chilling unit can be determined only according to the running time of the water chilling units. This will lead to continuous running of a water chilling unit with high power consumption, thus resulting in energy waste.

SUMMARY

The object of the present disclosure includes providing a method and apparatus for determining a water chilling unit for cooling a data center, to solve the technical problems mentioned in the above background section.

In a first aspect, the present disclosure provides a method for determining a water chilling unit for cooling a data center, and the method includes: acquiring a current water output parameter, a current water input parameter, a current water flow parameter and a current outdoor temperature parameter of each water chilling unit of the data center, the water output parameter including a cooling water output temperature parameter and a chilling water output temperature parameter, the water input parameter including a cooling water input temperature parameter and a chilling water input temperature parameter, and the water flow parameter including a cooling water flow parameter and a chilling water flow parameter; pre-processing the water output parameter, the water input parameter, the water flow parameter and the outdoor temperature parameter to obtain a characteristic parameter of each water chilling unit; importing the characteristic parameter of each water chilling unit into a pre-established machine learning model to obtain a current electric power of each water chilling unit; and determining a water chilling unit for cooling the data center on the basis of a preset cooling load, a rated cooling capacity of the water chilling unit and the current electric power of each water chilling unit.

In some embodiments, the pre-processing the water output parameter, the water input parameter, the water flow parameter and the outdoor temperature parameter to obtain a characteristic parameter of each water chilling unit includes: assigning, for any water chilling unit, respective corresponding preset weight values to the cooling water output temperature parameter, the chilling water output temperature parameter, the cooling water input temperature parameter, the chilling water input temperature parameter, the cooling water flow parameter, the chilling water flow parameter and outdoor temperature parameter; and selecting the characteristic parameter of each water chilling unit from the parameters assigned with the corresponding preset weight values.

In some embodiments, the determining a water chilling unit for cooling the data center on the basis of a preset cooling load, a rated cooling capacity of the water chilling unit and the current electric power of each water chilling unit includes: determining a number N of the water chilling unit for cooling the data center on the basis of the preset cooling load and the rated cooling capacity of the water chilling unit according to the following formula: $N=int(Q/W)+1$, where int is a rounding down operator, Q is the preset cooling load of the data center, and W is the rated cooling capacity of the water chilling unit; and selecting, based on an ascending order of the current electric power, N water chilling unit to cool the data center.

In some embodiments, before the characteristic parameter of each water chilling unit is imported into the pre-established machine learning model to obtain the current electric power of each water chilling unit, the method further includes: training the machine learning model by using water output parameters, water input parameters, water flow parameters and outdoor temperature parameters of a plurality of water chilling units with known electric powers.

In some embodiments, the machine learning model is a convolutional neural network model.

In a second aspect, the present disclosure provides an apparatus for determining a water chilling unit for cooling a data center, and the apparatus includes: an acquiring unit, for acquiring a current water output parameter, a current water input parameter, a current water flow parameter and a current outdoor temperature parameter of each water chilling unit of the data center, the water output parameter including a cooling water output temperature parameter and a chilling water output temperature parameter, the water input parameter including a cooling water input temperature parameter and a chilling water input temperature parameter, and the water flow parameter including a cooling water flow parameter and a chilling water flow parameter; a pre-processing unit, for pre-processing the water output parameter, the water input parameter, the water flow parameter and the outdoor temperature parameter to obtain a characteristic parameter of each water chilling unit; an importing unit, for importing the characteristic parameter of each water chilling unit into a pre-established machine learning model to obtain a current electric power of each water chilling unit; and a determining unit, for determining a water chilling unit for cooling the data center on the basis of a preset cooling load, a rated cooling capacity of the water chilling unit and the current electric power of each water chilling unit.

In some embodiments, the pre-processing unit is further configured for: assigning, for any water chilling unit, respective corresponding preset weight values to the cooling water output temperature parameter, the chilling water output temperature parameter, the cooling water input temperature parameter, the chilling water input temperature parameter, the cooling water flow parameter, the chilling water flow parameter and outdoor temperature parameter; and selecting the characteristic parameter of each water chilling unit from the parameters assigned with the corresponding preset weight values.

In some embodiments, the determining unit is further configured for: determining a number N of the water chilling unit for cooling the data center on the basis of the preset cooling load and the rated cooling capacity of the water chilling unit according to the following formula: N=int(Q/W)+1, where int is a rounding down operator, Q is the preset cooling load of the data center, and W is the rated cooling capacity of the water chilling unit; and selecting, based on an ascending order of the current electric power, N water chilling unit to cool the data center.

In some embodiments, the apparatus further includes a training unit which is configured for: before the characteristic parameter of each water chilling unit is imported into a pre-established machine learning model to obtain the current electric power of each water chilling unit, training the machine learning model by using water output parameters, water input parameters, water flow parameters and outdoor temperature parameters of a plurality of water chilling units with known electric power.

In some embodiments, the machine learning model is a convolutional neural network model.

In a third aspect, the present disclosure provides an electronic device including: one or more processors, and a storage device for storing one or more programs, wherein when the one or more programs are executed by the one or more processors, the one or more processors implement the method for determining a water chilling unit for cooling a data center in the first aspect.

In a fourth aspect, the present disclosure provides a computer readable storage medium on which computer programs are stored, and when the programs are executed by the processors, the method for determining a water chilling unit for cooling a data center in the first aspect is implemented.

With the method and apparatus for determining a water chilling unit for cooling a data center according to the present disclosure, a current water output parameter, a current water input parameter, a current water flow parameter and a current outdoor temperature parameter of each water chilling unit of the data center are acquired first, and then the water output parameter, the water input parameter, the water flow parameter and the outdoor temperature parameter are pre-processed to obtain a characteristic parameter of each water chilling unit; then, the characteristic parameter of each water chilling unit is imported into a pre-established machine learning model to obtain the current electric power of each water chilling unit; and finally, a water chilling unit for cooling the data center is determined on the basis of a preset cooling load, a rated cooling capacity of the water chilling unit and the current electric power of each water chilling unit. Therefore, the water chilling unit for cooling the data center may be determined according to the preset cooling load of the data center and the current electric power of each water chilling unit, such that the energy consumption of the data center can be reduced on the premise of satisfying the cooling load of the data center.

BRIEF DESCRIPTION OF THE DRAWINGS

Other features, objects and advantages of the present disclosure will become more apparent by reading the detailed description of the non-limiting embodiments with reference to the accompanying drawings.

DETAILED DESCRIPTION OF EMBODIMENTS

The present disclosure will be further described below in detail in combination with the accompanying drawings and the embodiments. It should be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should also be noted that the embodiments in the present disclosure and the features in the embodiments may be combined with each other on a non-conflict basis. The present disclosure will be described below in detail with reference to the accompanying drawings and in combination with the embodiments.

Figure 1:
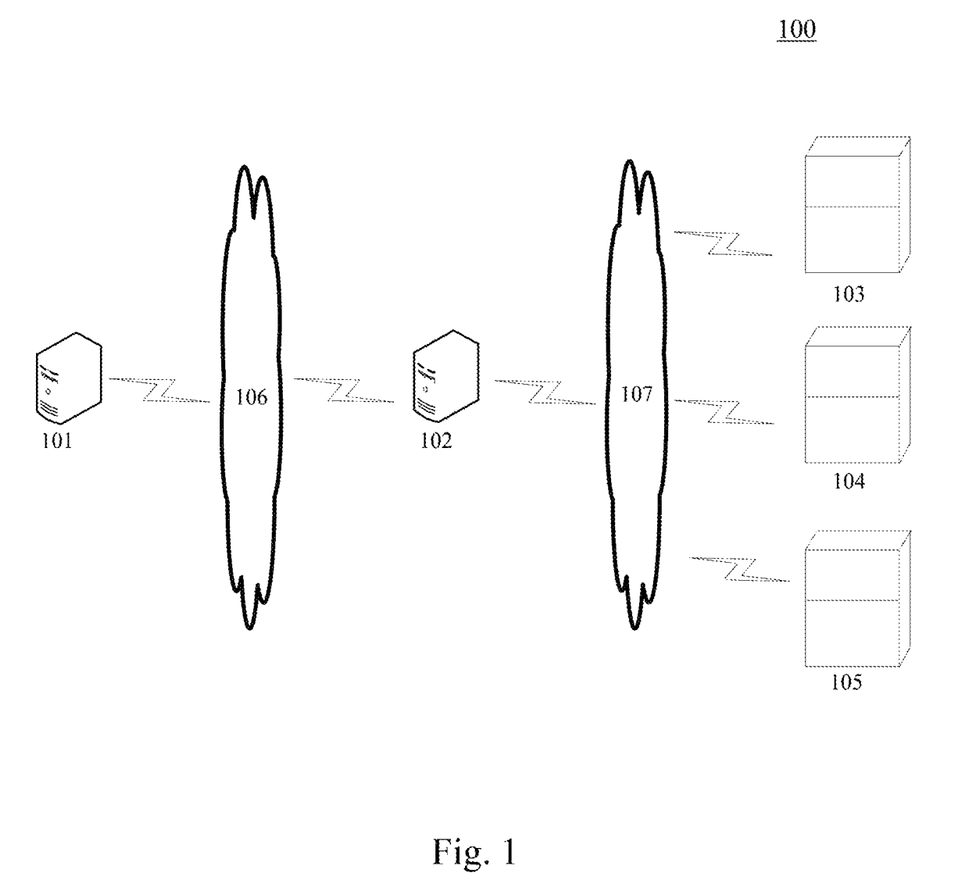
FIG. 1 is an architecture diagram of an exemplary system in which the present disclosure may be implemented.

FIG. 1 shows an exemplary architecture of a system 100 in which a method for determining a water chilling unit for cooling a data center or an apparatus for determining a water chilling unit for cooling a data center in the present disclosure may be implemented.

As shown in FIG. 1, the system architecture 100 may include a first server 101, a second server 102, water chilling units 103, 104 and 105, a network 106 and a network 107. The network 106 is used for providing a medium of a communication link between the first server 101 and the second server 102. The network 107 is used for providing a medium of a communication link between the second server 102 and the water chilling units 103, 104 and 105. The network 106 and the network 107 may include various connection types respectively, such as wired or wireless communication links, optical fiber cables, and the like.

The first server 101 may interact with the second server 102 through the network 106 to receive or send messages. The second server 102 may interact with the water chilling units 103, 104 and 105 through the network 107 to receive or send messages.

The first server 101 may be a server that provides various services, for example, a backend server that acquires water output parameters, water input parameters, water flow parameters, and outdoor temperature parameters of the water chilling units 103, 104 and 105 from the second server 102, and analyzes and processes the parameters. The first server 101 can send results of the analysis and processing of the parameters to the second server 102 through the network 106.

The second server 102 may be a server that provides various services, for example, a server that may receive, through the network 107, the water output parameters, the water input parameters, the water flow parameters, and the outdoor temperature parameters of the water chilling units 103, 104 and 105, collected by a sensor. The second server 102 may also send an start/shut down instruction to the water chilling units 103, 104 and 105 through the network 107 according to a processing result of the first server 101.

The water chilling units 103, 104 and 105 are various water chilling units providing a cold source. The water chilling units 103, 104 and 105 may include chilling water pipes, cooling water pipes, and chilling water inlets, chilling water outlets, cooling water inlets, and cooling water outlets. Temperature sensors may be arranged at the chilling water inlets, the chilling water outlets, cooling water inlets and cooling water outlets of the water chilling units 103, 104 and 105 in advance respectively, and may send chilling water input temperatures of the chilling water inlets, chilling water output temperatures of the chilling water outlets, cooling water input temperatures of the cooling water inlets and cooling water output temperatures of the cooling water outlets, detected in real time, to the second server 102 through the network 107 respectively.

It is worth noting that the first server 101 and the second server 102 may alternatively be a same server. Functions that the first server 101 and the second server 102 may be realized on the same server.

It should be noted that the method for determining a water chilling unit for cooling a data center according to the embodiments of the present disclosure is generally executed by the first server 101, and accordingly, the apparatus for determining a water chilling unit for cooling a data center is generally arranged in the first server 101.

It should be understood that the number of the first server, the second server, the water chilling unit, or the network in FIG. 1 is only schematic. According to an implementation requirement, any number of the first server, the second server, the water chilling unit or the network may be provided.

Figure 2:
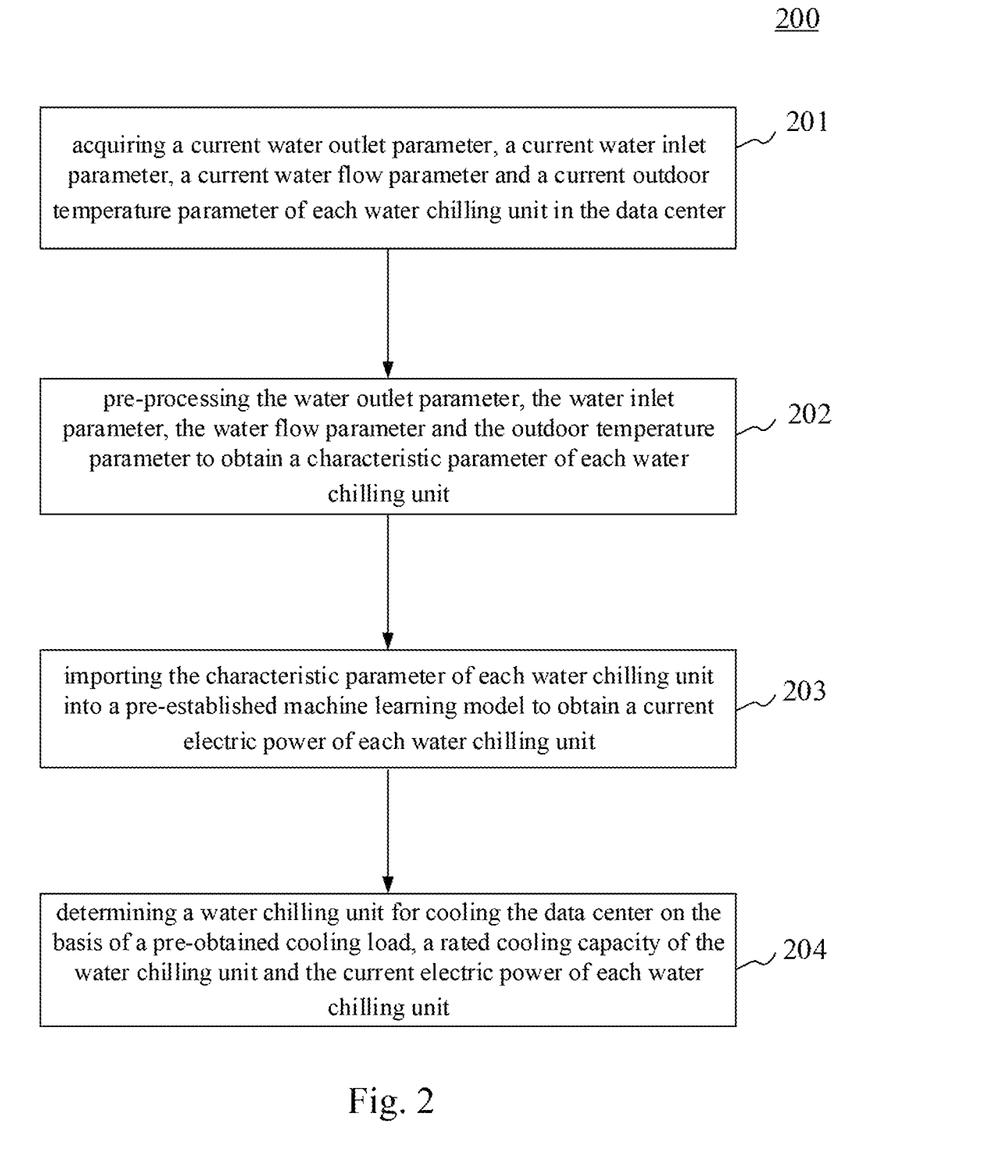
FIG. 2 is a flowchart of a method for determining a water chilling unit for cooling a data center according to some embodiments of the present disclosure.

Referring to FIG. 2, a flow 200 of a method for determining a water chilling unit for cooling a data center according to some embodiments of the present disclosure is shown. The method for determining a water chilling unit for cooling a data center includes steps 201 to 204.

Step 201 includes acquiring a current water output parameter, a current water input parameter, a current water flow parameter and a current outdoor temperature parameter of each water chilling unit in the data center.

In the present embodiment, an electronic device (e.g., the first server 101 shown in FIG. 1) on which the method for determining a water chilling unit for cooling a data center is implemented may acquire related parameters and an outdoor temperature parameter of each water chilling unit from the second server (e.g., the second server 102 shown in FIG. 1) through a wired connection or wireless connection. The related parameters of the water chilling unit include the current water output parameter, the current water input parameter, the current water flow parameter, etc. In addition, the electronic device can also acquire the running time of each water chilling unit from the second server.

The water output parameter may include a cooling water output temperature parameter and a chilling water output temperature parameter, the water input parameter may include a cooling water input temperature parameter and a chilling water input temperature parameter, and the water flow parameter may include a cooling water flow parameter and a chilling water flow parameter.

The second server may be a server that is preset in the data center to monitor a power environment system of the data center. Specifically, the second server may monitor the power environment of the data center by receiving collected water output parameter data, water input parameter data, water flow parameter data, etc. of each water chilling unit sent by a sensor pre-arranged in each water chilling unit.

In some optional implementations of the present embodiment, the outdoor temperature parameter may be, for example, an outdoor wet bulb temperature parameter.

In some optional implementations of the present embodiment, the electronic device may be the second server in FIG. 1.

Step 202 includes pre-processing the water output parameter, the water input parameter, the water flow parameter and the outdoor temperature parameter to obtain a characteristic parameter of each water chilling unit.

In the present embodiment, the electronic device may preprocess the water output parameter, the water input parameter, the water flow parameter, and the outdoor temperature parameter of each water chilling unit acquired in step 201.

In the present embodiment, the pre-processing process may include following steps.

First, data screening is performed on the water output parameter, the water input parameter, the water flow parameter and the outdoor temperature parameter of each water chilling unit. Specifically, the electronic device may perform wrong data screening on the acquired water output parameter, water input parameter, water flow parameter, and outdoor temperature parameter of each water chilling unit to eliminate wrong data. In this way, the deviation of an analysis result caused by wrong data can be avoided.

Second, for any parameter of the water chilling unit, a sequence having data pieces with equal time intervals in the current time period and corresponding to the parameter is generated. In the present embodiment, for any parameter of the water chilling unit, the second server may only store a data piece having a value changing compared with the value at a last instant prior to the instant of the data piece, and a time point at which the value changes. The electronic device may assign values to each parameter acquired from the second server based on time points having equal intervals within the current time period. For any parameter, the principle of assigning values based on time points having equal interval includes searching for any adjacent first and second time points having values of the parameter within the current time period, and corresponding values of the two time points, which are acquired from the second server. The first time point is earlier than the second time point; and the value of the parameter corresponding to each time point between the two time points is equal to the value of the parameter corresponding to the first time point. In this way, for each of the above parameters, the electronic device may obtain a sequence having data pieces with equal time intervals in the current time period and corresponding to each water chilling unit.

Finally, for any water chilling unit, noisy points may be eliminated from the parameters of the water chilling unit by using a filter method so as to select a characteristic parameter from the parameters. The filter method may be, for example, a variance filter method for respectively calculating a variance of the data sequence corresponding to each parameter, and selecting a parameter with a variance greater than a preset variance threshold as a characteristic parameter. It is assumed that the variances corresponding to the cooling water output temperature parameter, the chilling water output temperature parameter, the cooling water input temperature parameter, the chilling water input temperature parameter, the cooling water flow parameter, the chilling water flow parameter, and the outdoor temperature parameter of a water chilling unit in the current period are a1, a2, a3, a4, a5, a6, and a7 respectively. The variances a1, a2, a3, a4, a5, a6 and a7 are compared with a preset variance threshold A. The results of the comparisons are as follows: a1, a2, a3, a4 and a5 are greater than A, and a6 and a7 are smaller than A. Then, the cooling water output temperature parameter, the chilling water output temperature parameter, the cooling water input temperature parameter, the chilling water input temperature parameter, and the cooling water flow parameter can be determined as the characteristic parameters of the water chilling unit.

Step 203, importing the characteristic parameters of each water chilling unit into a pre-established machine learning model to obtain the current electric power of each water chilling unit.

In the present embodiment, the machine learning model may be established in advance in the electronic device. Input parameters of the machine learning model may be the characteristic parameters of any water chilling unit obtained in step 202, and an output of the machine learning model may include the current electric power corresponding to the water chilling unit. In addition, the output of the machine learning model may also include a real-time cooling capacity and the like corresponding to the water chilling unit.

In some optional implementations of the present embodiment, the method for determining a water chilling unit for cooling a data center further includes: before acquiring the current water output parameter, water input parameter, water flow parameter, and outdoor temperature parameter of each water chilling unit in the data center, training the machine learning model using water output parameters, water input parameters, water flow parameters, and outdoor temperature parameters of a plurality of water chilling units with known electric powers as sample data so that the electric power output by the machine learning model approaches actual electric power.

In some optional implementations of the present embodiment, the machine learning model may be a neural network model.

The electronic device imports the characteristic parameter corresponding to each water chilling unit and obtained in step 202 into the machine learning model to obtain the current electric power corresponding to each water chilling unit.

Step 204 includes determining a water chilling unit for cooling the data center on the basis of a pre-obtained cooling load, a rated cooling capacity of the water chilling unit and the current electric power of each water chilling unit.

The cooling load of the data center may be acquired from the second server by the electronic device. The cooling load of the data center is related to a calorific value of equipment (e.g. servers providing services to the Internet), heat transfer of a maintenance structure, solar radiation heat entering through an external window, heat dissipation of a hot body, heat dissipation of lights, etc, in a machine room. Equipment heat generation is a main factor. The second server can calculate the cooling load of maintaining a temperature (for example, 23+/−2 DEG C.) required by the data center according to the calorific value of equipment, the heat transfer quantity of the maintenance structure, the calorific value of solar radiation entering through the external window, the heat dissipation quantity of the hot body, the heat dissipation quantity of lights and the like in the machine room of the data center, which are collected in real time.

In the present embodiment, the electronic device may determine a water chilling unit needed for cooling the data center according to the pre-acquired cooling load of the data center and the rated cooling capacity (here the rated cooling capacity of each water chilling unit may be the same) of the water chilling unit. Specifically, the minimum number N of the water chilling unit needed for cooling the data center may be determined according to the cooling load of the data center and the rated cooling capacity of the water chilling unit, where N is greater than or equal to 1 and is a positive integer.

The determination of a specific number N can be calculated according to the following formula:

$$N=\text{int}(Q/W)+1 \qquad (1),$$

where, int is a rounding down operator, Q is the cooling load of the data center, and W is the rated cooling capacity of the water chilling unit.

In the present embodiment, the electronic device may select N water chilling units having the total electric power less than a preset threshold from a plurality of water chilling units to cool the data center.

In the present embodiment, the electronic device may send the result of the N water chilling units selected from the plurality of water chilling units to the second server. The selection result of the N water chilling units may include a serial number and the current electric power corresponding to each of the determined N water chilling units.

In some application scenarios, the second server may send a running stop instruction to water chilling units other than the N water chilling units determined to cool the data center through a network, thus controlling other water chilling units to shut down and achieving the energy conservation of the data center.

In this way, since the N water chilling units for cooling the data center can be selected according to the real-time running electric power of each water chilling unit, when not all water chilling units are required to run to satisfying the cooling load of the data center, the N water chilling units with the total electric power smaller than a preset threshold may be selected according to the above method to cool the data center, and other water chilling units may be shut down at the same time. Therefore, extra power consumed by selected N water chilling units with relatively high power consumption to cool the data center may be reduced, thus achieving the energy conservation.

Figure 3:
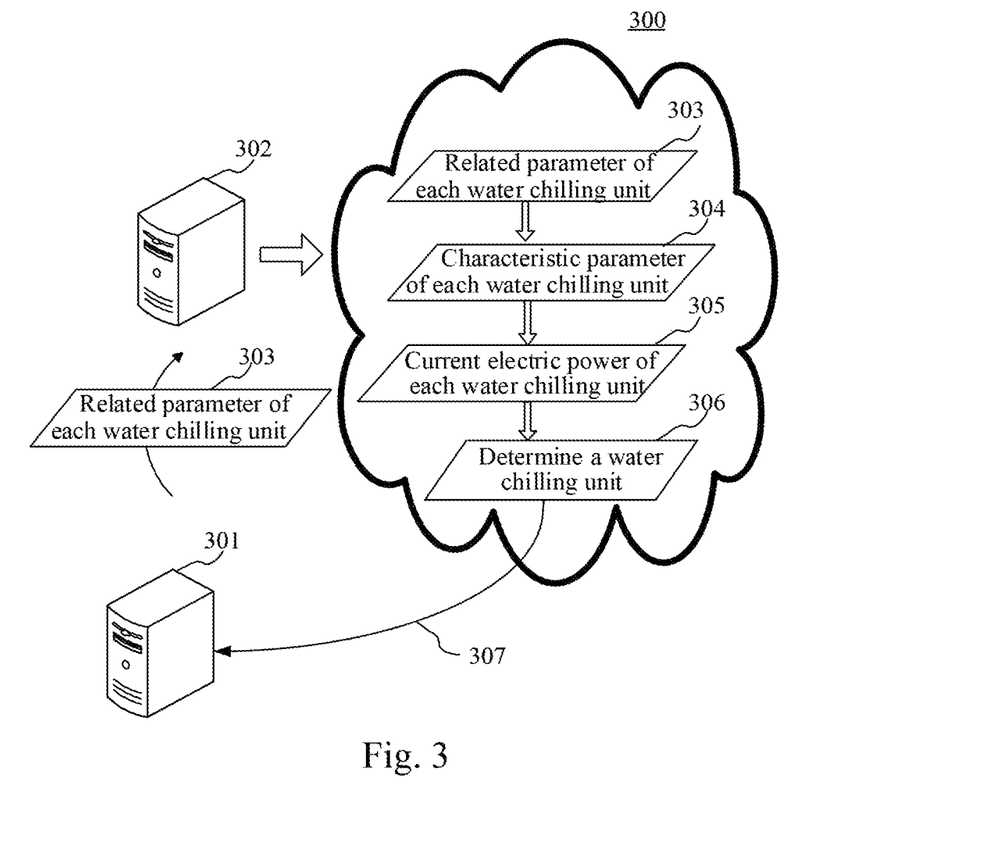
FIG. 3 is a schematic diagram of an application scenario of the method for determining a water chilling unit for cooling a data center according to some embodiments of the present disclosure.

Referring to FIG. 3, FIG. 3 is a schematic diagram of an application scenario of the method for determining a water chilling unit for cooling a data center in the present embodiment. In the application scenario 300 of FIG. 3, the electronic device 302 acquires related parameters 303 (e.g., water output parameters, water input parameters, water flow parameters, and outdoor temperature parameters) of each water chilling unit from the server 301 of a dynamic loop monitoring system and an automatic control system of the data center. The electronic device 302 pre-processes the related parameters 303 of each water chilling unit to obtain a characteristic parameter 304 of each water chilling unit. Then, the electronic device 302 imports the characteristic parameter 304 into a pre-established machine learning model to obtain a current electric power 305 of each water chilling unit. The electronic device determines N water chilling units 306 for cooling the data center according to the current cooling load of the data center, the rated electric power of the water chilling units, and the electric power of each water chilling unit in the current period, which are acquired from the server of the dynamic ring system and the automatic control system server. The electronic device sends the information of the determined water chilling units 306, such as serial number information of each of the determined N water chilling units, to the server of the dynamic ring monitoring system and the automatic control system, so that the server of the dynamic ring monitoring system and the automatic control system may send a running stop instruction 307 to water chilling units other than the N water chilling units.

With the method according to the present embodiment, the electric power of each water chilling unit in the current period through the machine learning model is acquired, and N water chilling units used for cooling the data center and having the electric power smaller than a preset threshold are determined according to the preset cooling load of the data center and the electric power of each water chilling unit, so as to reduce the energy consumption of the data center.

In some optional implementations of the present embodiment, step 204 may include sub-steps 2041 and 2042.

Sub-step 2041 includes determining the number N of the water chilling unit for cooling the data center on the basis of the preset cooling load and the rated cooling capacity of the water chilling unit. Specifically, the number N of the water chilling unit may be determined according to the following formula:

$$N=\operatorname{int}(Q/W)+1 \qquad (1),$$

where, int is a rounding down operator, Q is the preset cooling load of the data center, and W is the rated cooling capacity of the water chilling unit.

Sub-step 2042 includes selecting, based on an ascending order of the current electric power, N water chilling unit to cool the data center.

The electronic device may select, based on an ascending order of the current electric power, N water chilling unit to cool the data center.

Since the electronic device selects, based on an ascending order of the current electric power, N water chilling units from a plurality of water chilling units to cool the data center, in any period of time, the water chilling units that may satisfy the cooling load of the data center and consume the least power are operated by the data center to cool the data center, thus further reducing the energy consumption of the data center.

In some optional implementations of the present embodiment, in the above step 202, for any water chilling unit, after obtaining sequences of data pieces having equal time intervals, the sequences respectively corresponding to the cooling water output temperature parameter, chilling water output temperature parameter, cooling water input temperature parameter, chilling water input temperature parameter, cooling water flow parameter, chilling water flow parameter, and outdoor temperature parameter, a corresponding preset weight value may be assigned to each parameter of the water chilling unit. Here, the preset weight value corresponding to each parameter may not be equal. Specifically, the corresponding preset weight value may be assigned to each parameter according to experience. Then, the characteristic parameter of the water chilling unit is selected from the parameters with assigned preset weight values. For example, a parameter for which a sum of products between a corresponding numerical value at each time point and a corresponding weight value greater than a predetermined numerical value is taken as the characteristic parameter of the water chilling unit. For example, sequences having data pieces with equal time intervals and respectively corresponding to the cooling water output temperature parameter, the chilling water output temperature parameter, the cooling water input temperature parameter, the chilling water input temperature parameter, the cooling water flow parameter, the chilling water flow parameter, and the outdoor temperature parameter are $B[b1, b2, b3, b4, b5]$, $C[c1, c2, c3, c4, c5]$, $D[d1, d2, d3, d4, d5]$, $E[e1, e2, e3, e4, e5]$, $F[f1, f2, f3, f4, f5]$, $G[g1, g2, g3, g4, g5]$, and $H[h1, h2, h3, h4, h5]$; the preset weight values corresponding to the cooling water output temperature parameter, the chilling water output temperature parameter, the cooling water input temperature parameter, the chilling water input temperature parameter, the cooling water flow parameter, the chilling water flow parameter and the outdoor temperature parameter are $B1$, $C1$, $D1$, $E1$, $F1$, $G1$, and $H1$ respectively; and the sums regarding the preset weight values and data sequences corresponding thereto are: $B2=B1\times(b1+b2+b3+b4+b5)$, $C2=C1\times(c1+c2+c3+c4+c5)$, $D2=D1\times(d1+d2+d3+d4+d5)$, $E2=E1\times(e1+e2+e3+e4+e5)$, $F2=F1\times(f1+f2+f3+f4+f5)$, $G2=G1\times(g1+g2+g3+g4+g5)$, and $H2=H1\times(h1+h2+h3+h4+h5)$. Assuming that $B2$, $C2$, $D2$ and $E2$ each are greater than a predetermined value K, and $F2$, $G2$ and $H2$ each are smaller than the predetermined value K, the cooling water output temperature parameter, the chilling water output temperature parameter, the cooling water input temperature parameter, and the chilling water input temperature parameter are selected as the characteristic parameters of the water chilling unit.

In some embodiments, the respective preset weight values corresponding to the cooling water output temperature parameter, the chilling water output temperature parameter, the cooling water input temperature parameter, the chilling water input temperature parameter, the cooling water flow parameter, the chilling water flow parameter, and the outdoor temperature parameter may alternatively be obtained by training the machine learning model for multiple times.

Figure 4:
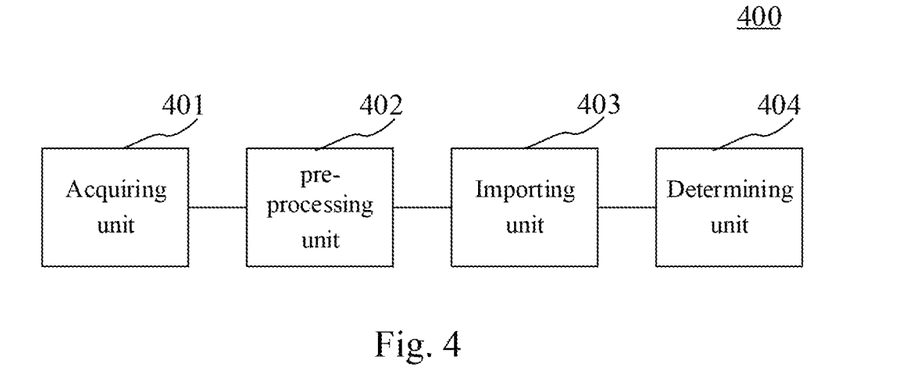
FIG. 4 is a structure schematic diagram of an apparatus for determining a water chilling unit for cooling a data center according to some embodiments of the present disclosure.

Further referring to FIG. 4, as the implementation of the method shown in the above figures, the present disclosure provides an embodiment of an apparatus for determining a water chilling unit for cooling a data center, the embodiment of the apparatus corresponds to the embodiment of the method shown in FIG. 2, and the apparatus can be specifically applied to various types of electronic devices.

As shown in FIG. 4, the apparatus 400 for determining a water chilling unit for cooling a data center in the present embodiment includes an acquiring unit 401, a pre-processing unit 402, an importing unit 403, and a determining unit 404. The acquiring unit 401 is configured for acquiring a current water output parameter, a current water input parameter, a current water flow parameter and a current outdoor temperature parameter of each water chilling unit in the data center. The water output parameter includes a cooling water output temperature parameter and a chilling water output temperature parameter, the water input parameter includes a cooling water input temperature parameter and a chilling water input temperature parameter, and the water flow parameter includes a cooling water flow parameter and a chilling water flow parameter. The pre-processing unit 402 is configured for pre-processing the water output parameter, the water input parameter, the water flow parameter and the outdoor temperature parameter to obtain a characteristic parameter of each water chilling unit. The importing unit 403 is configured for importing the characteristic parameter of each water chilling unit into a pre-established machine learning model to obtain the current electric power of each water chilling unit. The determining unit 404 is configured for determining a water chilling unit for cooling the data center on the basis of a preset cooling load, a rated cooling capacity of the water chilling unit and the current electric power of each water chilling unit.

In the present embodiment, the specific processing and technical effects thereof of the acquiring unit 401, the pre-processing unit 402, the importing unit 403 and the determining unit 404 of the apparatus 400 for determining a water chilling unit for cooling a data center may refer to related descriptions of step 201, step 202 and step 203 in the corresponding embodiment in FIG. 2 respectively, and will not be repeated here.

In some optional implementations of the present embodiment, the pre-processing unit 402 is further configured for, for any water chilling unit, after obtaining sequences having data pieces with equal time intervals and respectively corresponding to the cooling water output temperature parameter, chilling water output temperature parameter, cooling water input temperature parameter, chilling water input temperature parameter, cooling water flow parameter, chilling water flow parameter, and outdoor temperature parameter, assigning a corresponding preset weight value to each parameter of the water chilling unit. Here, the preset weight value corresponding to each parameter may not be equal. Specifically, the corresponding preset weight value may be assigned to each parameter according to experience. Then, the characteristic parameter of the water chilling unit is selected from the parameters assigned with preset weight values.

In some optional implementations of the present embodiment, the determining unit 404 is further configured for: determining the number N of the water chilling unit for cooling the data center on the basis of the preset cooling load and the rated cooling capacity of the water chilling unit according to the following formula:

$$N=\text{int}(Q/W)+1 \qquad (1),$$

where, int is a rounding down operator, Q is the preset cooling load of the data center, and W is the rated cooling capacity of the water chilling unit; and selecting, based on an ascending order of the current electric power, N water chilling unit to cool the data center.

In some optional implementations of the present embodiment, the apparatus 400 for determining a water chilling unit for cooling a data center further includes a training unit (not shown) which is configured for: before the characteristic parameter of each water chilling unit is imported into a pre-established machine learning model to obtain the current electric power of each water chilling unit, training the machine learning model by using the water output parameter, the water input parameter, the water flow parameter and the outdoor temperature parameter of a plurality of water chilling units with known electric powers.

In some optional implementations of the present embodiment, the machine learning model is a convolutional neural network model.

Figure 5:
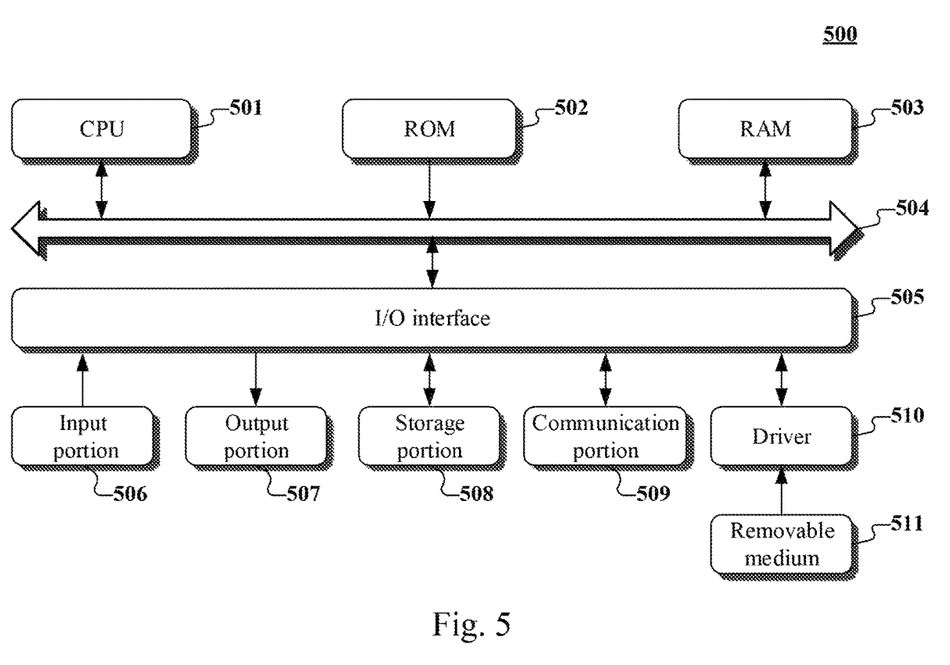
FIG. 5 is a structure diagram of a computer system adapted to implementing an electronic device according to some embodiments of the present disclosure.

Referring to FIG. 5, a schematic structural diagram of a computer system 500 adapted to implement an electronic device of the embodiments of the present disclosure is shown.

As shown in FIG. 5, the computer system 500 includes a central processing unit (CPU) 501, which may execute various appropriate actions and processes in accordance with a program stored in a read-only memory (ROM) 502 or a program loaded into a random access memory (RAM) 503 from a storage portion 508. The RAM 503 also stores various programs and data required by operations of the system 500. The CPU 501, the ROM 502 and the RAM 503 are connected to each other through a bus 504. An input/output (I/O) interface 505 is also connected to the bus 504.

The following components are connected to the I/O interface 505: an input portion 506 including a keyboard, a mouse etc.; an output portion 507 including a cathode ray tube (CRT), a liquid crystal display device (LCD), a speaker etc.; a storage portion 508 including a hard disk and the like; and a communication portion 509 comprising a network interface card, such as a LAN card and a modem. The communication portion 509 performs communication processes via a network, such as the Internet. A driver 510 is also connected to the I/O interface 505 as required. A removable medium 511, such as a magnetic disk, an optical disk, a magneto-optical disk, and a semiconductor memory, may be installed on the driver 510, to facilitate the retrieval of a computer program from the removable medium 511, and the installation thereof on the storage portion 508 as needed.

In particular, according to embodiments of the present disclosure, the process described above with reference to the flow chart may be implemented in a computer software program. For example, an embodiment of the present disclosure includes a computer program product, which includes a computer program that is tangibly embedded in a machine-readable medium. The computer program includes program codes for executing the method as illustrated in the flow chart. In such an embodiment, the computer program may be downloaded and installed from a network via the communication portion 509, and/or may be installed from the removable media 511. The computer program, when executed by the central processing unit (CPU) 501, implements the above mentioned functionalities as defined by the methods of the present disclosure. It should be noted that the computer readable medium in the present disclosure may be computer readable signal medium or computer readable storage medium or any combination of the above two. An example of the computer readable storage medium may include, but not limited to: electric, magnetic, optical, electromagnetic, infrared, or semiconductor systems, apparatus, elements, or a combination any of the above. A more specific example of the computer readable storage medium may include but is not limited to: electrical connection with one or more wire, a portable computer disk, a hard disk, a random access memory (RAM), a read only memory (ROM), an erasable programmable read only memory (EPROM or flash memory), a fibre, a portable compact disk read only memory (CD-ROM), an optical memory, a magnet memory or any suitable combination of the above. In the present disclosure, the computer readable storage medium may be any physical medium containing or storing programs which can be used by a command execution system, apparatus or element or incorporated thereto. In the present disclosure, the computer readable signal medium may include data signal in the base band or propagating as parts of a carrier, in which computer readable program codes are carried. The propagating signal may take various forms, including but not limited to: an electromagnetic signal, an optical signal or any suitable combination of the above. The signal medium that can be read by computer may be any computer readable medium except for the computer readable storage medium. The computer readable medium is capable of transmitting, propagating or transferring programs for use by, or used in combination with, a command execution system, apparatus or element. The program codes contained on the computer readable medium may be transmitted with any suitable medium including but not limited to: wireless, wired, optical cable, RF medium etc., or any suitable combination of the above.

The flow charts and block diagrams in the accompanying drawings illustrate architectures, functions and operations that may be implemented according to the systems, methods and computer program products of the various embodiments of the present disclosure. In this regard, each of the blocks in the flow charts or block diagrams may represent a module, a program segment, or a code portion, said module, program segment, or code portion comprising one or more executable instructions for implementing specified logic functions. It should also be noted that, in some alternative implementations, the functions denoted by the blocks may occur in a sequence different from the sequences shown in the figures. For example, any two blocks presented in succession may be executed, substantially in parallel, or they may sometimes be in a reverse sequence, depending on the function involved. It should also be noted that each block in the block diagrams and/or flow charts as well as a combination of blocks may be implemented using a dedicated hardware-based system executing specified functions or operations, or by a combination of a dedicated hardware and computer instructions.

The units involved in the embodiments of the present disclosure may be implemented by means of software or hardware. The described units may also be provided in a processor, for example, described as: a processor, including an acquiring unit, a pre-processing unit, an importing unit and a determining unit, where the names of these units do not in some cases constitute a limitation to such units themselves. For example, the acquiring unit may also be described as "a unit for acquiring a current water output parameter, a current water input parameter, a current water flow parameter and a current outdoor temperature parameter of each water chilling unit in the data center."

In another aspect, the present disclosure further provides a computer-readable medium. The computer-readable medium may be the computer medium included in the apparatus in the above described embodiments, or a stand-alone computer-readable medium not assembled into the apparatus. The computer-readable medium stores one or more programs. The one or more programs, when executed by a device, cause the device to: acquire a current water output parameter, a current water input parameter, a current water flow parameter and a current outdoor temperature parameter of each water chilling unit in the data center, the water output parameter including a cooling water output temperature parameter and a chilling water output temperature parameter, the water input parameter including a cooling water input temperature parameter and a chilling water input temperature parameter, and the water flow parameter including a cooling water flow parameter and a chilling water flow parameter; pre-process the water output parameter, the water input parameter, the water flow parameter and the outdoor temperature parameter to obtain a characteristic parameter of each water chilling unit; import the characteristic parameter of each water chilling unit into a pre-established machine learning model to obtain the current electric power of each water chilling unit; and determine a water chilling unit for cooling the data center on the basis of a preset cooling load, a rated cooling capacity of the water chilling unit and the current electric power of each water chilling unit.

The above description only provides an explanation of the preferred embodiments of the present disclosure and the technical principles used. It should be appreciated by those skilled in the art that the inventive scope of the present disclosure is not limited to the technical solutions formed by the particular combinations of the above-described technical features. The inventive scope should also cover other technical solutions formed by any combinations of the above-described technical features or equivalent features thereof without departing from the concept of the disclosure. Technical schemes formed by the above-described features being interchanged with, but not limited to, technical features with similar functions disclosed in the present disclosure are examples.

What is claimed is:

1. A method for determining a water chilling unit for cooling a data center, the method comprising:
    acquiring current water output parameters, current water input parameters, current water flow parameters and current outdoor temperature parameters of water chilling units of the data center, the water output parameters comprising a cooling water output temperature parameter and a chilling water output temperature parameter, the water input parameters comprising a cooling water input temperature parameter and a chilling water input temperature parameter, and the water flow parameters comprising a cooling water flow parameter and a chilling water flow parameter;
    pre-processing the water output parameters, the water input parameters, the water flow parameters and the outdoor temperature parameters to obtain characteristic parameters of the water chilling units;
    importing the characteristic parameters of the water chilling units into a pre-established machine learning model to obtain current electric powers of the water chilling units; and
    determining a water chilling unit for cooling the data center on the basis of a preset cooling load, a rated cooling capacity of the water chilling units and the current electric powers of the water chilling units, wherein the determining a water chilling unit for cooling the data center on the basis of a preset cooling load, a rated cooling capacity of the water chilling units and the current electric powers of the water chilling units comprises:
    determining a number N of the required water chilling units for cooling the data center on the basis of the preset cooling load and the rated cooling capacity of the water chilling units according to the following formula:

$N=\text{int}(Q/W)+1$, wherein, int is a rounding down operator, Q is the preset cooling load of the data center, and W is the rated cooling capacity of the water chilling units; and selecting, based on an ascending order of the current electric powers, N water chilling units to cool the data center.

2. The method according to claim 1, wherein the pre-processing the water output parameters, the water input parameters, the water flow parameters and the outdoor temperature parameters to obtain characteristic parameters of water chilling units comprises:
    assigning, for any water chilling unit, respective corresponding preset weight values to the cooling water output temperature parameter, the chilling water output temperature parameter, the cooling water input temperature parameter, the chilling water input temperature parameter, the cooling water flow parameter, the chilling water flow parameter and outdoor temperature parameter; and selecting the characteristic parameter of the any water chilling unit from the parameters assigned with the corresponding preset weight values.

3. The method according to claim 1, wherein before importing the characteristic of the water chilling units into a pre-established machine learning model to obtain the current electric powers of the water chilling units, the method further comprises:
training the machine learning model by using water output parameters, water input parameters, water flow parameters and outdoor temperature parameters of a plurality of water chilling units with known electric powers.

4. The method according to claim 1, wherein the machine learning model is a convolutional neural network model.

5. An apparatus for determining a water chilling unit for cooling a data center, the apparatus comprising:
at least one processor; and
a memory storing instructions, the instructions when executed by the at least one processor, cause the at least one processor to perform operations, the operations comprising:
acquiring current water output parameters, current water input parameters, current water flow parameters and current outdoor temperature parameters of water chilling units of the data center, the water output parameters comprising a cooling water output temperature parameter and a chilling water output temperature parameter, the water input parameters comprising a cooling water input temperature parameter and a chilling water input temperature parameter, and the water flow parameters comprising a cooling water flow parameter and a chilling water flow parameter;
pre-processing the water output parameters, the water input parameters, the water flow parameters and the outdoor temperature parameters to obtain characteristic parameters of the water chilling units;
importing the characteristic parameters of the water chilling units into a pre-established machine learning model to obtain current electric powers of the water chilling units; and
determining a water chilling unit for cooling the data center on the basis of a preset cooling load, a rated cooling capacity of the water chilling units and the current electric powers of the water chilling units, wherein the determining a water chilling unit for cooling the data center on the basis of a preset cooling load, a rated cooling capacity of the water chilling units and the current electric powers of the water chilling units comprises:
determining a number N of the required water chilling units for cooling the data center on the basis of the preset cooling load and the rated cooling capacity of the water chilling units according to the following formula:

$N=\text{int}(Q/W)+1$, wherein, int is a rounding down operator, Q is the preset cooling load of the data center, and W is the rated cooling capacity of the water chilling units; and selecting, based on an ascending order of the current electric powers, N water chilling units to cool the data center.

6. The apparatus according to claim 5, wherein the pre-processing the water output parameters, the water input parameters, the water flow parameters and the outdoor temperature parameters to obtain characteristic parameters of the water chilling units comprises:
assigning, for any water chilling unit, respective corresponding preset weight values to the cooling water output temperature parameter, the chilling water output temperature parameter, the cooling water input temperature parameter, the chilling water input temperature parameter, the cooling water flow parameter, the chilling water flow parameter and outdoor temperature parameter; and selecting the characteristic parameter of the any water chilling unit from the parameters assigned with the corresponding preset weight values.

7. The apparatus according to claim 5, wherein before the characteristic parameters of the water chilling units are imported into the pre-established machine learning model to obtain the current electric powers of the water chilling units, the operations further comprises training the machine learning model by using water output parameters, water input parameters, water flow parameters and outdoor temperature parameters of a plurality of water chilling units with known electric powers.

8. The apparatus according to claim 5, wherein the machine learning model is a convolutional neural network model.

9. A non-transitory computer medium, storing a computer program, wherein the program, when executed by a processor, causes the processor to
perform operations, the operations comprising:
acquiring current water output parameters, current water input parameters, current water flow parameters and current outdoor temperature parameters of water chilling units of the data center, the water output parameters comprising a cooling water output temperature parameter and a chilling water output temperature parameter, the water input parameters comprising a cooling water input temperature parameter and a chilling water input temperature parameter, and the water flow parameters comprising a cooling water flow parameter and a chilling water flow parameter;
pre-processing the water output parameters, the water input parameters, the water flow parameters and the outdoor temperature parameters to obtain characteristic parameters of the water chilling units;
importing the characteristic parameters of the water chilling units into a pre-established machine learning model to obtain current electric powers of the water chilling units; and
determining a water chilling unit for cooling the data center on the basis of a preset cooling load, a rated cooling capacity of the water chilling units and the current electric powers of the water chilling units, wherein the determining a water chilling unit for cooling the data center on the basis of a preset cooling load, a rated cooling capacity of the water chilling units and the current electric powers of the water chilling units comprises:
determining a number N of the required water chilling units for cooling the data center on the basis of the preset cooling load and the rated cooling capacity of the water chilling units according to the following formula:

$N=\text{int}(Q/W)+1$, wherein, int is a rounding down operator, Q is the preset cooling load of the data center, and W is the rated cooling capacity of the water chilling units; and selecting, based on an ascending order of the current electric powers, N water chilling units to cool the data center.

* * * * *